United States Patent
Hsiao et al.

(10) Patent No.: US 10,360,986 B1
(45) Date of Patent: Jul. 23, 2019

(54) MEMORY MANAGEMENT METHOD AND STORAGE CONTROLLER

(71) Applicant: Shenzhen EpoStar Electronics Limited CO., Shenzhen (CN)

(72) Inventors: Yu-Hua Hsiao, Hsinchu County (TW); Yi-Ming Yang, New Taipei (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 15/997,716

(22) Filed: Jun. 5, 2018

(30) Foreign Application Priority Data

Mar. 20, 2018 (TW) .............................. 107109486 A

(51) Int. Cl.
  G11C 8/08 (2006.01)
  G11C 16/34 (2006.01)
  G11C 16/04 (2006.01)
  G11C 16/26 (2006.01)
  G11C 16/16 (2006.01)

(52) U.S. Cl.
  CPC ............ G11C 16/3427 (2013.01); G11C 8/08 (2013.01); G11C 16/0483 (2013.01); G11C 16/16 (2013.01); G11C 16/26 (2013.01); G11C 16/3404 (2013.01)

(58) Field of Classification Search
  CPC ... G11C 16/3427; G11C 8/08; G11C 16/0483; G11C 16/16; G11C 16/26; G11C 16/3404
  USPC .................................................... 365/185.02
  See application file for complete search history.

(56) References Cited

U.S. PATENT DOCUMENTS

| 6,118,697 A * | 9/2000 | Tanzawa ............ G11C 16/0483 365/185.11 |
| 7,177,199 B2 | 2/2007 | Chen et al. |
| 7,889,537 B2 | 2/2011 | Edahiro et al. |
| 2008/0117684 A1 * | 5/2008 | Hemink ............ G11C 11/5628 365/185.19 |

(Continued)

FOREIGN PATENT DOCUMENTS

| CN | 102077298 | 5/2011 |
| CN | 102246241 | 11/2011 |

(Continued)

OTHER PUBLICATIONS

"Office Action of Taiwan Counterpart Application", dated Sep. 28, 2018, p. 1-p. 3.

Primary Examiner — Harry W Byrne
(74) Attorney, Agent, or Firm — JCIPRNET

(57) ABSTRACT

A memory management method and a storage controller are provided. The memory management method includes: dividing a plurality of word lines of a first block into a plurality of word line groups and recording a characteristic value for each of the word line groups; accumulating the characteristic values of a second word line group and a third word line group when reading a first word line group, wherein the second word line group and the third word line group are directly adjacent to the first word line group; and reading the second word line group via a first optimal read voltage group when the characteristic value of the second word line group is greater than a first threshold, wherein the first optimal read voltage group is different from a default read voltage group corresponding to the second word line group.

16 Claims, 3 Drawing Sheets

(56) References Cited

U.S. PATENT DOCUMENTS

| | | | |
|---|---|---|---|
| 2008/0273388 A1* | 11/2008 | Chin | G11C 11/5628 365/185.17 |
| 2009/0129157 A1* | 5/2009 | Honda | G11C 11/5628 365/185.03 |
| 2010/0172171 A1* | 7/2010 | Azuma | G11C 13/003 365/148 |
| 2012/0257455 A1* | 10/2012 | Oh | G11C 16/10 365/185.22 |
| 2013/0094294 A1 | 4/2013 | Kwak et al. | |
| 2014/0037086 A1* | 2/2014 | Seol | G06F 7/58 380/44 |

FOREIGN PATENT DOCUMENTS

| | | |
|---|---|---|
| CN | 105988880 | 10/2016 |
| CN | 107797935 | 3/2018 |
| TW | 201535384 | 9/2015 |

\* cited by examiner

MEMORY MANAGEMENT METHOD AND STORAGE CONTROLLER

CROSS-REFERENCE TO RELATED APPLICATION

This application claims the priority benefit of Taiwan application serial no. 107109486, filed on Mar. 20, 2018. The entirety of the above-mentioned patent application is hereby incorporated by reference herein and made a part of this specification.

BACKGROUND OF THE INVENTION

Field of the Invention

The invention relates to a memory management method and a storage controller, and more particularly, to a memory management method and a storage controller that can reduce read disturb error.

Description of Related Art

A read disturb effect exists in NAND flash. In short, it can be seen from the circuit diagram of a NAND flash array that, even if only a certain page is read, pages adjacent to the read page connected by the same voltage line are all disturbed. After a certain number of reads is accumulated, errors that cannot be corrected by an error correction code start to be generated.

To solve the issue of read disturb, in general, the read counter of the block is recorded, and data of the block is moved to other blocks when the read count of the block is greater than a predetermined value. As a result, excessive block data moving operations occur. Therefore, how to more efficiently solve the issue of read disturb is an important object for those skilled in the art.

SUMMARY OF THE INVENTION

The invention provides a memory management method and a storage controller that can more efficiently solve the issue of read disturb and reduce read disturb error.

The invention provides a memory management method suitable for controlling a storage device provided with a rewritable non-volatile memory module. The storage device is controlled by a storage controller. The rewritable non-volatile memory module includes a plurality of blocks. Each block includes a plurality of word lines. Each word line is formed by a plurality of memory cells. The blocks include a first block. The memory management method includes the following. The word lines of the first block are divided into a plurality of word line groups and a characteristic value is recorded for each of the word line groups via the storage controller. When the storage controller reads a first word line group in the word line groups, the storage controller accumulates characteristic values of a second word line group and a third word line group in the word line groups, wherein the second word line group and the third word line group are directly adjacent to the first word line group. When the characteristic value of the second word line group is greater than a first threshold, the storage controller instructs to read the second word line group via a first optimal read voltage group, wherein the first optimal read voltage group is different from a default read voltage group corresponding to the second word line group.

The invention provides a storage controller suitable for controlling a storage device provided with a rewritable non-volatile memory module. The rewritable non-volatile memory module includes a plurality of blocks. Each block includes a plurality of word lines. Each word line is formed by a plurality of memory cells. The blocks include a first block. The storage controller includes a connection interface circuit coupled to a host system; a memory interface control circuit coupled to a rewritable non-volatile memory module; and a processor coupled to the connection interface circuit and the memory interface control circuit. In particular, the processor divides the word lines of the first block into a plurality of word line groups and records a characteristic value for each of the word line groups. When the processor reads a first word line group in the word line groups, the processor accumulates characteristic values of a second word line group and a third word line group in the word line groups, wherein the second word line group and the third word line group are directly adjacent to the first word line group. When the characteristic value of the second word line group is greater than a first threshold, the processor instructs to read the second word line group via a first optimal read voltage group, wherein the first optimal read voltage group is different from a default read voltage group corresponding to the second word line group.

Based on the above, in the memory management method and the storage controller of the invention, the word lines of one block are divided into a plurality of word line groups and a characteristic value is recorded for each of the word line groups. When one of the word line groups is read, the characteristic values of word line groups directly adjacent to the read word line group are accumulated. When the characteristic value of one word line group is greater than a threshold, the storage controller instructs to read the word line group for which the characteristic value is greater than the threshold via an optimal read voltage group different from a default read voltage group to reduce error caused by read disturb.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the present embodiment, the storage device includes a rewritable non-volatile memory module and a storage device controller (also referred to as a storage controller or storage control circuit). Moreover, the storage device is used with a host system such that the host system can write data into the storage device or read data from the storage device.

Figure 1:
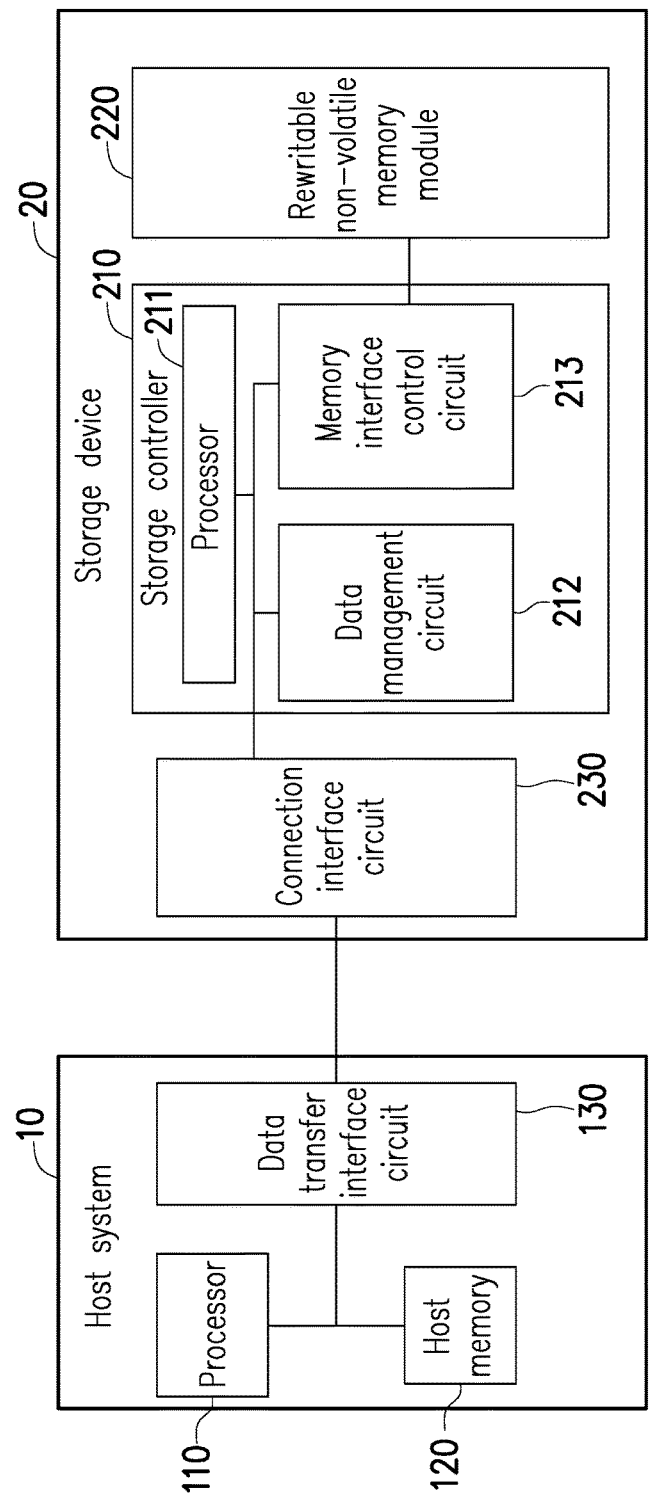
FIG. 1 is a block schematic of a host system and a storage device shown according to an embodiment of the invention.

FIG. 1 is a block schematic of a host system and a storage device shown according to an embodiment of the invention.

Referring to FIG. 1, a host system 10 includes a processor 110, a host memory 120, and a data transfer interface circuit 130. In the present embodiment, the data transfer interface circuit 130 is coupled to (also referred to as electrically connected to) the processor 110 and the host memory 120. In another embodiment, the processor 110, the host memory 120, and the data transfer interface circuit 130 are coupled to one another via a system bus.

The storage device 20 includes a storage controller 210, a rewritable non-volatile memory module 220, and a connection interface circuit 230. In particular, the storage controller 210 includes a processor 211, a data management circuit 212, and a memory interface control circuit 213.

In the present embodiment, the host system 10 is coupled to the storage device 20 via the data transfer interface circuit 130 and the connection interface circuit 230 of the storage device 20 to perform data access operations. For instance, the host system 10 can store data into the storage device 20 or read data from the storage device 20 via the data transfer interface circuit 130.

In the present embodiment, the processor 110, the host memory 120, and the data transfer interface circuit 130 can be disposed on a motherboard of the host system 10. The quantity of the data transfer interface circuit 130 can be one or a plurality. The motherboard can be coupled to the storage device 20 in a wired or wireless method via the data transfer interface circuit 130. The storage device 20 can be, for instance, a flash drive, memory card, solid-state drive (SSD), or wireless memory storage device. The wireless memory storage device can be, for instance, a memory storage device based on various wireless communication techniques such as a near-field communication (NFC) memory storage device, Wireless Fidelity (WiFi) memory storage device, Bluetooth memory storage device, or low-power Bluetooth memory storage device (such as iBeacon). Moreover, the motherboard can also be coupled to various I/O devices such as a global positioning system (GPS) module, network interface card, wireless transfer device, keyboard, screen, or speaker via the system bus.

In the present embodiment, the data transfer interface circuit 130 and the connection interface circuit 230 are interface circuits compatible with the Peripheral Component Interconnect Express (PCI Express) standard. Moreover, data transfer between the data transfer interface circuit 130 and the connection interface circuit 230 is conducted using a rapid Non-Volatile Memory express (NVMe) communication protocol.

However, it should be understood that, the invention is not limited thereto, and the data transfer interface circuit 130 and the connection interface circuit 230 can also comply with the Parallel Advanced Technology Attachment (PATA) standard, Institute of Electrical and Electronic Engineers (IEEE) 1394 standard, Serial Advanced Technology Attachment (SATA) standard, Universal Serial Bus (USB) standard, SD interface standard, Ultra High Speed-I (UHS-I) Interface standard, Ultra High Speed-II (UHS-II) interface standard, Memory Stick (MS) interface standard, Multi-Chip Package interface standard, Multi Media Card (MMC) interface standard, eMMC interface standard, Universal Flash Storage (UFS) interface standard, eMCP interface standard, CF interface standard, Integrated Device Electronics (IDE) standard, or other suitable standards. Moreover, in another embodiment, the connection interface circuit 230 can be packaged in one chip with the storage controller 210, or the connection interface circuit 230 is provided outside a chip containing the storage controller 210.

In the present embodiment, the host memory 120 is configured to temporarily store instructions or data executed by the processor 110. For instance, in the present exemplary embodiment, the host memory 120 can be, for instance, a dynamic random-access memory (DRAM) or a static random-access memory (SRAM). However, it should be understood that, the invention is not limited thereto, and the host memory 120 can also be other suitable memories.

The storage controller 210 is configured to execute a plurality of logic gates or control instructions implemented in a hardware form or in a firmware form. The storage controller 210 also performs operations such as data writing, reading, and erasing in the rewritable non-volatile memory module 220 according to the instructions of the host 10.

More specifically, the processor 211 in the storage controller 210 is a hardware with computing power and is configured to control the overall operation of the storage controller 210. Specifically, the processor 211 has a plurality of control instructions. During the operation of the storage device 20, the control instructions are executed to perform operations such as data writing, reading, and erasing.

It should be mentioned that, in the present embodiment, the processor 110 and the processor 211 are, for instance, central processing units (CPU), microprocessors, or other programmable processing units, digital signal processors (DSP), programmable controllers, application-specific integrated circuits (ASIC), programmable logic devices (PLD), or other similar circuit elements, and the invention is not limited thereto.

In an embodiment, the storage controller 210 further has a read-only memory (not shown) and a random-access memory (not shown). In particular, the read-only memory has a boot code, and when the storage controller 210 is enabled, the processor 211 first executes the boot code to load control instructions stored in the rewritable non-volatile memory module 220 into the random-access memory of the storage controller 210. Next, the processor 211 runs the control instructions to perform operations such as data writing, reading, and erasing. In another embodiment, the control instructions of the processor 211 can also be stored in a specific region of the rewritable non-volatile memory module 220 in codes, such as a physical storage unit in the rewritable non-volatile memory module 220 dedicated to the storage of system data.

In the present embodiment, as described above, the storage controller 210 further includes a data management circuit 212 and a memory interface control circuit 213. It should be mentioned that, the operations executed by each portion of the storage controller 220 can also be regarded as the operations executed by the storage controller 220.

In particular, the data management circuit 212 is coupled to the processor 211, the memory interface control circuit 213, and the connection interface circuit 230. The data management circuit 212 is configured to receive the instructions of the processor 211 to perform data transfer. For instance, data is read from the host system 10 (such as the host memory 120) via the connection interface circuit 230, and the read data is written into the rewritable non-volatile memory module 220 via the memory interface control circuit 213 (such as performing a write operation according to a write instruction from the host system 10). As another example, data is read from one or a plurality of physical units (data can be read from one or a plurality of memory cells in one or a plurality of physical units) of the rewritable non-volatile memory module 220 via the memory interface control circuit 213, and the read data is written into the host system 10 (such as the host memory 120) via the connection interface circuit 230 (such as a read operation is performed according to a read instruction from the host system 10). In another embodiment, the data management circuit 212 can also be integrated in the processor 211.

The memory interface control circuit 213 is configured to receive an instruction of the processor 211 to perform a write (also referred to as programming) operation, read operation, and erase operation on the rewritable non-volatile memory module 220 with the data management circuit 212.

For instance, the processor 211 can execute a write instruction sequence (or the processor 211 instructs the data management circuit 212 to issue a write instruction sequence to the memory interface control circuit 213) to instruct the memory interface control circuit 213 to write data into the rewritable non-volatile memory module 220; the processor 211 can execute a read instruction sequence (or the processor 211 instructs the data management circuit 212 to issue a read instruction sequence to the memory interface control circuit 213) to instruct the memory interface control circuit 213 to read data from one or a plurality of physical units (also referred to as target physical units) of the rewritable non-volatile memory module 220 corresponding to the read instructions; and the processor 211 can execute an erase instruction sequence (or the processor 211 instructs the data management circuit 212 to issue an erase instruction sequence to the memory interface control circuit 213) to instruct the memory interface control circuit 213 to perform an erase operation on the rewritable non-volatile memory module 220. The write instruction sequence, read instruction sequence, and erase instruction sequence can independently include one or a plurality of program codes or instruction codes and be configured to instruct the rewritable non-volatile memory module 220 to execute a corresponding operation such as writing, reading, and erasing. In an embodiment, the processor 211 can further issue other types of instructions to the memory interface control circuit 213 to execute a corresponding operation on the rewritable non-volatile memory module 220.

Moreover, data to be written into the rewritable non-volatile memory module 220 is converted into a format acceptable to the rewritable non-volatile memory module 220 via the memory interface control circuit 213. Specifically, if the processor 211 is to access the rewritable non-volatile memory module 220, then the processor 211 sends a corresponding instruction sequence to the memory interface control circuit 213 to instruct the memory interface control circuit 213 to execute the corresponding operation. For instance, the instruction sequences can include a write instruction sequence instructing data writing, a read instruction sequence instructing data reading, an erase instruction sequence instructing data erasing, and corresponding instruction sequences configured to instruct various memory operations (such as changing a plurality of default read voltage values of a default read voltage group to perform a read operation or executing a trash recycling program). The instruction sequences can include one or a plurality of signals or data on a bus. The signals or data can include an instruction code or a program code. For instance, when reading an instruction sequence, information such as read identification code or memory address is included.

The rewritable non-volatile memory module 220 is coupled to the storage controller 210 (the memory interface control circuit 213) and is configured to store data written by the host system 10. The rewritable non-volatile memory module 220 can be, for instance, a single-level cell (SLC) NAND flash memory module (i.e., a flash memory module for which one memory cell can store 1 bit), multi-level cell (MLC) NAND flash memory module (i.e., a flash memory module for which one memory cell can store 2 bits), triple-level cell (TLC) NAND flash memory module (i.e., a flash memory module for which one memory cell can store 3 bits), 3D NAND flash memory module, vertical NAND flash memory module, other flash memory modules, or other memory modules having the same characteristics.

The storage controller 210 provides a plurality of logical units to the rewritable non-volatile memory module 220. The host system 10 accesses user data stored in the plurality of physical units via the logical units provided. Here, each logical unit can be formed by one or a plurality of logical addresses. For instance, the logical units can be logical blocks, logical pages, or logical sectors. One logical unit can be mapped to one or a plurality of physical units, wherein the physical unit can be one or a plurality of physical addresses, one or a plurality of physical sectors, one or a plurality of physical programming units, or one or a plurality of physical erasing units. In the present embodiment, the logical units are logical blocks, and the logical subunits are logical pages. Each logical unit has a plurality of logical subunits. In the present embodiment, the memory cell is the smallest unit for writing (programming) data. The physical unit (physical block) is the smallest unit of erasing, that is, the smallest number of memory cells erased together in each physical block.

In the present embodiment, a plurality of memory cells of the rewritable non-volatile memory module 220 forms a plurality of word lines, and the word lines form a plurality of physical blocks (also referred to as physical erasing units or physical units). Specifically, the memory cells on the same word line can be divided into one or a plurality of physical programming units. As a result, the plurality of memory cells of the rewritable non-volatile memory module 220 can form a plurality of physical blocks (physical units).

Figure 2:
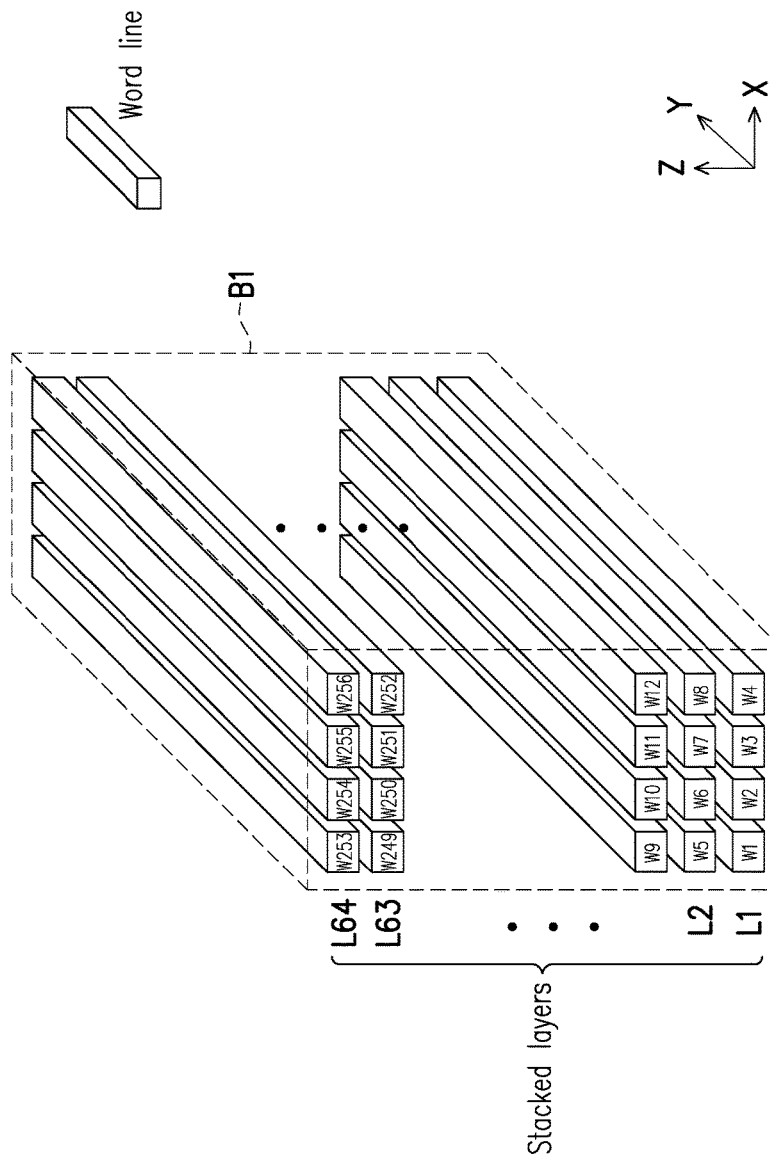
FIG. 2 is a schematic of a plurality of word lines of a 3D physical block shown according to an embodiment of the invention.

FIG. 2 is a schematic of a plurality of word lines of a 3D physical block shown according to an embodiment of the invention. Referring to FIG. 2, for instance, a physical block B1 of the rewritable non-volatile memory module 220 has a plurality of 256 word lines (such as W1 to W256) faulted by a plurality of memory cells, and every 4 word lines are grouped into one stacked layer. That is, the physical block B1 has 64 stacked layers (such as L1 to L64). A plurality of word lines is placed in the limited space of the physical block B1 itself during the memory process in which the physical block B1 is formed. Therefore, when the word lines of one of the stacked layers are repeatedly read, error bits on the word lines of directly adjacent stacked layers are significantly increased. Although FIG. 2 is exemplified by one stacked layer having four word lines, the invention is not limited thereto. In other embodiments, one stacked layer of the physical block can also have other quantities of word lines.

In the example of FIG. 2, memory cells having the same location in the XY plane on different stacked layers can be connected to one another via one word line. For instance, the first memory cells (or N-th memory cells) of word lines W1, W5, W9 . . . W249, and W253 can be connected to one another via one bit line. Therefore, the first memory cell on word line W5 is directly adjacent to the first memory cell on word line W1 and the first memory cell on word line W9 on the bit line.

Table 1 is an example of the structure of a word line in a physical block according to an embodiment of the invention.

TABLE 1

| Stacked layer | Word line | | | | | | | | | | | |
|---|---|---|---|---|---|---|---|---|---|---|---|---|
| | 0 | 1 | 2 | 3 | 4 | 5 | 6 | 7 | 8 | 9 | 10 | 11 |
| 0 | 0 | 1 | 2 | 3 | 4 | 5 | 6 | 7 | 8 | 9 | 10 | 11 |
| 1 | 12 | 13 | 14 | 15 | 16 | 17 | 18 | 19 | 20 | 21 | 22 | 23 |
| 2 | 24 | 25 | 26 | 27 | 28 | 29 | 30 | 31 | 32 | 33 | 34 | 35 |
| 3 | 36 | 37 | 38 | 39 | 40 | 41 | 42 | 43 | 44 | 45 | 46 | 47 |
| 4 | 48 | 49 | 50 | 51 | 52 | 53 | 54 | 55 | 56 | 57 | 58 | 59 |
| 5 | 60 | 61 | 62 | 63 | 64 | 65 | 66 | 67 | 68 | 69 | 70 | 71 |
| 6 | 72 | 73 | 74 | 75 | 76 | 77 | 78 | 79 | 80 | 81 | 82 | 83 |
| 7 | 84 | 85 | 86 | 87 | 88 | 89 | 90 | 91 | 92 | 93 | 94 | 95 |
| 8 | 96 | 97 | 98 | 99 | 100 | 101 | 102 | 103 | 104 | 105 | 106 | 107 |
| 9 | 108 | 109 | 110 | 111 | 112 | 113 | 114 | 115 | 116 | 117 | 118 | 119 |
| 10 | 120 | 121 | 122 | 123 | 124 | 125 | 126 | 127 | 128 | 129 | 130 | 131 |
| 11 | 132 | 133 | 134 | 135 | 136 | 137 | 138 | 139 | 140 | 141 | 142 | 143 |
| 12 | 144 | 145 | 146 | 147 | 148 | 149 | 150 | 151 | 152 | 153 | 154 | 155 |
| 13 | 156 | 157 | 158 | 159 | 160 | 161 | 162 | 163 | 164 | 165 | 166 | 167 |
| 14 | 168 | 169 | 170 | 171 | 172 | 173 | 174 | 175 | 176 | 177 | 178 | 179 |
| 15 | 180 | 181 | 182 | 183 | 184 | 185 | 186 | 187 | 188 | 189 | 190 | 191 |
| 16 | 192 | 193 | 194 | 195 | 196 | 197 | 198 | 199 | 200 | 201 | 202 | 203 |
| 17 | 204 | 205 | 206 | 207 | 208 | 209 | 210 | 211 | 212 | 213 | 214 | 215 |
| 18 | 216 | 217 | 218 | 219 | 220 | 221 | 222 | 223 | 224 | 225 | 226 | 227 |
| 19 | 228 | 229 | 230 | 231 | 232 | 233 | 234 | 235 | 236 | 237 | 238 | 239 |
| 20 | 240 | 241 | 242 | 243 | 244 | 245 | 246 | 247 | 248 | 249 | 250 | 251 |
| 21 | 252 | 253 | 254 | 255 | 256 | 257 | 258 | 259 | 260 | 261 | 262 | 263 |
| 22 | 264 | 265 | 266 | 267 | 268 | 269 | 270 | 271 | 272 | 273 | 274 | 275 |
| 23 | 276 | 277 | 278 | 279 | 280 | 281 | 282 | 283 | 284 | 285 | 286 | 287 |
| 24 | 288 | 289 | 290 | 291 | 292 | 293 | 294 | 295 | 296 | 297 | 298 | 299 |
| 25 | 300 | 301 | 302 | 303 | 304 | 305 | 306 | 307 | 308 | 309 | 310 | 311 |
| 26 | 312 | 313 | 314 | 315 | 316 | 317 | 318 | 319 | 320 | 321 | 322 | 323 |
| 27 | 324 | 325 | 326 | 327 | 328 | 329 | 330 | 331 | 332 | 333 | 334 | 335 |
| 28 | 336 | 337 | 338 | 339 | 340 | 341 | 342 | 343 | 344 | 345 | 346 | 347 |
| 29 | 348 | 349 | 350 | 351 | 352 | 353 | 354 | 355 | 356 | 357 | 358 | 359 |

In Table 1, the physical block has a total of 30 stacked layers from 0 to 29. Each stacked layer has 12 word lines.

Table 2 is an example of the generation of read disturb caused by the reading of specific word lines in the structure of Table 1 according to an embodiment of the invention.

| Stacked layer | Word line | Lower page | Middle page | Upper page |
|---|---|---|---|---|
| 23 | 276 | 2 | 9 | 9 |
| 23 | 277 | 1 | 4 | 9 |
| 23 | 278 | 3 | 7 | 11 |
| 23 | 279 | 4 | 7 | 10 |
| 23 | 280 | 2 | 9 | 14 |
| 23 | 281 | 3 | 10 | 11 |
| 23 | 282 | 2 | 8 | 10 |
| 23 | 283 | 1 | 10 | 11 |
| 23 | 284 | 3 | 6 | 12 |
| 23 | 285 | 2 | 6 | 13 |
| 23 | 286 | 1 | 13 | 9 |
| 23 | 287 | 3 | 9 | 11 |
| 24 | 288 | 7 | 45 | 117 |
| 24 | 289 | 5 | 51 | 146 |
| 24 | 290 | 8 | 70 | 142 |
| 24 | 291 | 4 | 49 | 165 |
| 24 | 292 | 6 | 55 | 142 |
| 24 | 293 | 5 | 67 | 131 |
| 24 | 294 | 3 | 58 | 138 |
| 24 | 295 | 4 | 45 | 137 |
| 24 | 296 | 6 | 52 | 136 |
| 24 | 297 | 5 | 70 | 158 |
| 24 | 298 | 8 | 67 | 154 |
| 24 | 299 | 9 | 57 | 137 |
| 25 | 300 | 3 | 5 | 9 |
| 25 | 301 | 2 | 7 | 5 |
| 25 | 302 | 2 | 6 | 7 |
| 25 | 303 | 1 | 5 | 7 |
| 25 | 304 | 2 | 4 | 8 |
| 25 | 305 | 4 | 8 | 7 |
| 25 | 306 | 4 | 6 | 7 |
| 25 | 307 | 3 | 12 | 6 |

-continued

| Stacked layer | Word line | Lower page | Middle page | Upper page |
|---|---|---|---|---|
| 25 | 308 | 2 | 5 | 5 |
| 25 | 309 | 3 | 6 | 4 |
| 25 | 310 | 1 | 6 | 3 |
| 25 | 311 | 1 | 6 | 6 |
| 26 | 312 | 5 | 47 | 121 |
| 26 | 313 | 9 | 41 | 129 |
| 26 | 314 | 5 | 60 | 119 |
| 26 | 315 | 7 | 48 | 141 |
| 26 | 316 | 2 | 47 | 123 |
| 26 | 317 | 5 | 40 | 128 |
| 26 | 318 | 8 | 45 | 126 |
| 26 | 319 | 7 | 50 | 122 |
| 26 | 320 | 3 | 59 | 126 |
| 26 | 321 | 6 | 63 | 134 |
| 26 | 322 | 6 | 58 | 136 |
| 26 | 323 | 7 | 36 | 82 |
| 27 | 324 | 4 | 9 | 11 |
| 27 | 325 | 1 | 12 | 12 |
| 27 | 326 | 3 | 7 | 11 |
| 27 | 327 | 5 | 9 | 15 |
| 27 | 328 | 5 | 8 | 11 |
| 27 | 329 | 2 | 7 | 13 |
| 27 | 330 | 2 | 10 | 11 |
| 27 | 331 | 3 | 7 | 14 |
| 27 | 332 | 3 | 7 | 11 |
| 27 | 333 | 2 | 6 | 11 |
| 27 | 334 | 3 | 13 | 10 |
| 27 | 335 | 3 | 9 | 8 |

In Table 2, the physical blocks of the TLC NAND flash memory module are shown, and therefore one word line includes the three pages of lower page, middle page, and upper page. In Table 2, the numbers in the lower page, middle page, and upper page fields represent the number of error bits. The embodiment of Table 2 simulates three million page read operations performed on stacked layer 25, and the numbers of error bits of stacked layer 25 and other stacked layers are recorded. It can be shown in Table 2 that the numbers of error bits of stacked layer 25 and stacked layers 23 and 27 are all rather low, but stacked layers 24 and 26 directly adjacent to stacked layer 25 have higher number of error bits. In particular, the upper pages of stacked layers 24 and 26 both have 100 or more number of error bits. It can be known from Table 2 that, after a plurality of reads is performed on word lines 300 to 311 (or referred to as word line groups) of stacked layer 25, the numbers of error bits of stacked layer 25 and stacked layers 23 and 27 are not significantly increased, but the numbers of error bits of stacked layers 24 and 26 directly adjacent to stacked layer 25 are significantly increased. This indicates performing a plurality of read operations on a specific stacked layer only significantly increases the number of error bits of stacked layers directly adjacent to the specific stacked layer, and the number of error bits of the specific stacked layer is not significantly increased.

Table 3 is the relationship between the read count and number of error bits of a word line group and a voltage group applied to the word line group according to an embodiment of the invention.

TABLE 3

| Word line group | Word line 0 . . . . . . line X | | Word line group read count | Number of error bits (V0) | Voltage group |
|---|---|---|---|---|---|
| 0 | Low read count with even distribution | | Low | Low | V0 |
| 1 | | | Low | Low | V0 |
| 2 | | | Low | Low | V0 |
| 3 | | | Low | Low | V0 |
| 4 | | | Low | Low | V0 |
| 5 | | | Low | Low | V0 |
| 6 | | | Low | Low | V0 |

In Table 3, an example in which all of the word line groups are evenly read and the total read count is low is shown. When the read count of all of the word line groups is "low", the number of error bits of all of the word line groups is also "low". Therefore, only a default read voltage group V0 needs to be applied to all of the word line groups to perform a subsequent read operation. It should be mentioned that, the voltage quantities included in the default voltage group V0 can be different according to the type of the rewritable non-volatile memory module 220. When the rewritable non-volatile memory module 220 is a TLC NAND flash memory, the default voltage group V0 can include seven different voltages to identify three bits in one memory cell. When the rewritable non-volatile memory module 220 is an MLC NAND flash memory, the default voltage group V0 can include three different voltages to identify two bits in one memory cell.

Table 4 is the relationship between the read count and number of error bits of a word line group and a voltage group applied to the word line group according to another embodiment of the invention.

TABLE 4

| Word line group | Word line 0 . . . . . . line X | | Word line group read count | Number of error bits (V0) | Voltage group |
|---|---|---|---|---|---|
| 0 | High read count with even distribution | | Medium | Medium | V1 |
| 1 | | | Medium | Medium | V1 |
| 2 | | | Medium | Medium | V1 |
| 3 | | | Medium | Medium | V1 |
| 4 | | | Medium | Medium | V1 |
| 5 | | | Medium | Medium | V1 |
| 6 | | | Medium | Medium | V1 |

In Table 4, an example in which all of the word line groups are evenly read and the total read count is high is shown. In Table 4, in the case that seven million reads are performed on the block and the seven million reads are evenly spread in word line groups 0 to 6, since the seven million reads are evenly spread, the read count of all of the word line groups is "medium", and the number of error bits generated in the application of the voltage group V0 is also "medium". At this point, the processor 211 instructs optimal voltage group V1 to be applied to perform a subsequent read operation to reduce the number of error bits.

Table 5 is the relationship between the read count and number of error bits of a word line group and a voltage group applied to the word line group according to another embodiment of the invention.

TABLE 5

| Word line group | Word line 0 . . . . . . line X | | Word line group read count | Number of error bits (V0) | Voltage group |
|---|---|---|---|---|---|
| 0 | | | Low | Low | V0 |
| 1 | | | Low | Low | V0 |
| 2 | Read disturbed by word line group 3 | | Low | High | V2 |
| 3 | High read count and concentrated in word line group 3 | | High | Low | V0 |
| 4 | Read disturbed by word line group 3 | | Low | High | V2 |
| 5 | | | Low | Low | V0 |
| 6 | | | Low | Low | V0 |

In Table 5, an example in which a single word line group 3 is read and the total read count is high is shown. In Table 5, in the case that seven million reads are performed on word line group 3, the read count of word line group 3 is "high" but the number of error bits is "low". However, although the read counts of word line groups 2 and 4 are "low", since word line groups 2 and 4 are directly adjacent to word line group 3, the numbers of error bits of word line groups 2 and 4 are "high". At this point, the processor 211 instructs optimal voltage group V2 to be applied to word line groups 2 and 4 to perform a subsequent read operation to reduce the number of error bits.

Table 6 is the relationship between the read count and number of error bits of a word line group and a voltage group applied to the word line group according to another embodiment of the invention.

TABLE 6

| Word line group | Word line 0 ... ... Word line X | Word line group read count | Number of error bits (V0) | Voltage group |
|---|---|---|---|---|
| 0 | | Low | Low | V0 |
| 1 | | Low | Low | V0 |
| 2 | Read disturbed by word line group 3 | Low | High | V3 |
| 3 | High read count and concentrated in word line group 3 (Read disturbed by word line group 4 at the same time) | High | High | V3 |
| 4 | High read count and concentrated in word line group 4 (Read disturbed by word line group 3 at the same time) | High | High | V3 |
| 5 | Read disturbed by word line group 4 | Low | High | V3 |
| 6 | | Low | Low | V0 |

In Table 6, an example in which two word line groups 3 and 4 are read and the total read count is high is shown. In Table 6, in the case that seven million reads are respectively performed on word line groups 3 and 4, the read counts of word line groups 3 and 4 are "high". Since word line groups 2 and 4 are read disturbed by word line group 3 and word line groups 3 and 5 are read disturbed by word line group 4, the numbers of error bits of word line groups 2, 3, 4, and 5 are all "high". At this point, the processor 211 instructs optimal voltage group V3 to be applied to word line groups 2, 3, 4, and 5 to perform a subsequent read operation to reduce the number of error bits.

Table 7 is the relationship between the read count and number of error bits of a word line group and a voltage group applied to the word line group according to another embodiment of the invention.

TABLE 7

| Word line group | Word line 0 ... ... Word line X | Word line group read count | Number of error bits (V0) | Voltage group | Read group 3 | Read group 4 | Total number of error bits |
|---|---|---|---|---|---|---|---|
| 0 | | Low | Low | V0 | | | |
| 1 | | Low | Low | V0 | | | |
| 2 | Read disturbed by word line group 3 | Low | High | V3 | E | | E |
| 3 | High read count and concentrated in word line group 3 (Read disturbed by word line group 4 at the same time) | High | High | V3 | R | E | E |
| 4 | High read count and concentrated in word line group 4 (Read disturbed by word line group 3 at the same time) | High | High | V3 | E | R | E |
| 5 | Read disturbed by word line group 4 | Low | High | V3 | | E | E |
| 6 | | Low | Low | V0 | | | |

In Table 7, the relationship between the read word line group and the generated total number of error bits is further provided based on Table 6. The fields of "read group 3" show that error bit "E" is generated in word line groups 2 and 4 when read "R" is performed on word line group 3, and the fields of "read group 4" show that error bit "E" is generated in word line groups 3 and 5 when read "R" is performed on word line group 4. Based on the above, word line groups 2, 3, 4, and 5 all have a total number of error bits of "E".

Table 8 is the relationship between the read count and number of error bits of a word line group and a voltage group applied to the word line group according to another embodiment of the invention.

TABLE 8

| Word line group | Word line 0 | ... | ... | Word line X | Word line group read count | Number of error bits (V0) | Voltage group | Read group 2 | Read group 3 | Read group 4 | Total number of error bits |
|---|---|---|---|---|---|---|---|---|---|---|---|
| 0 | | | | | Low | Low | V0 | | | | |
| 1 | Read disturbed by word line group 2 | | | | Low | High | V4 | E | | | E |
| 2 | High read count and concentrated in word line group 2 (Read disturbed by word line group 3 at the same time) | | | | High | High | V4 | R | E | | E |
| 3 | High read count and concentrated in word line group 3 (Read disturbed by word line group 2 and 4 at the same time) | | | | High | Ultra High | V5 | E | R | E | 2E |
| 4 | High read count and concentrated in word line group 4 (Read disturbed by word line group 3 at the same time) | | | | High | High | V4 | | E | R | E |
| 5 | Read disturbed by word line group 4 | | | | Low | High | V4 | | | E | E |
| 6 | | | | | Low | Low | V0 | | | | |

In Table 8, an example in which three word line groups 2, 3, and 4 are read and the total read count is high is shown. In Table 8, in the case that seven million reads are respectively performed on word line groups 2, 3, and 4, the read counts of word line groups 2, 3, and 4 are "high". Since word line groups 1 and 3 are read disturbed by word line group 2, word line groups 2 and 4 are read disturbed by word line group 3, and word line groups 3 and 5 are read disturbed by word line group 4, the numbers of error bits of word line groups 1, 2, 4, and 5 are all "high". Moreover, since word line group 3 is read disturbed by word line groups 2 and 4 at the same time, the number of error bits of word line group 3 is "ultra high". Referring to the fields of total number of error bits at the same time, the total numbers of error bits of word line groups 1, 2, 4, and 5 are all "E" but the total number of error bits of word line group 3 is "2E". Therefore, when the processor 211 instructs optimal voltage group V4 to be applied to the word line groups 1, 2, 4, and 5 to perform a subsequent read operation to reduce the number of error bits, the processor 211 further instructs optimal voltage group V5 to be applied to word line group 3 to perform a subsequent read operation to reduce the number of error bits.

Table 9 is the relationship between the read count and number of error bits of a word line group and a voltage group applied to the word line group according to another embodiment of the invention.

TABLE 9

| Word line group | Word line 0 | ... | ... | Word line X | Word line group read count | Number of error bits (V0) | Characteristic Value | Voltage group | Read group 2 | Read group 3 | Read group 4 | Total number of error bits |
|---|---|---|---|---|---|---|---|---|---|---|---|---|
| 0 | | | | | Low | Low | Small | V0 | | | | |
| 1 | Read disturbed by word line group 2 | | | | Low | High | Large | V4 | E | | | E |
| 2 | High read count and concentrated in word line group 2 (Read disturbed by word line group 3 at the same time) | | | | High | High | Large | V4 | R | E | | E |
| 3 | High read count and concentrated in word line group 3 (Read disturbed by word line group 2 and 4 at the same time) | | | | High | Ultra High | Very Large | V5 | E | R | E | 2E |
| 4 | High read count and concentrated in word line group 4 (Read disturbed by word line group 3 at the same time) | | | | High | High | Large | V4 | | E | R | E |
| 5 | Read disturbed by word line group 4 | | | | Low | High | Large | V4 | | | E | E |
| 6 | | | | | Low | Low | Small | V0 | | | | |

Table 9 is substantially the same as Table 8, and the difference is only that the size of the characteristic value of each word line group is included. When one word line group is read, the characteristic values of word line groups directly adjacent to the read word line group are accumulated. Therefore, a high read count of word line group 2 produces large characteristic values for word line groups 1 and 3. Similarly, a high read count of word line group 3 produces large characteristic values for word line groups 2 and 4 and a high read count of word line group 4 produces large characteristic values for word line groups 3 and 5. The characteristic value of word line group 3 is affected by the high read count of word line groups 2 and 4 at the same time, and therefore the characteristic value of word line group 3 is also ultra large. It can also be known from Table 9 that, the characteristic value and the number of error bits (V0) are highly positively-correlated.

It should be mentioned that, the voltage quantities included in optimal voltage groups V1 to V5 can be different according to the type of the rewritable non-volatile memory module 220, similarly to optimal voltage group V0.

Figure 3:
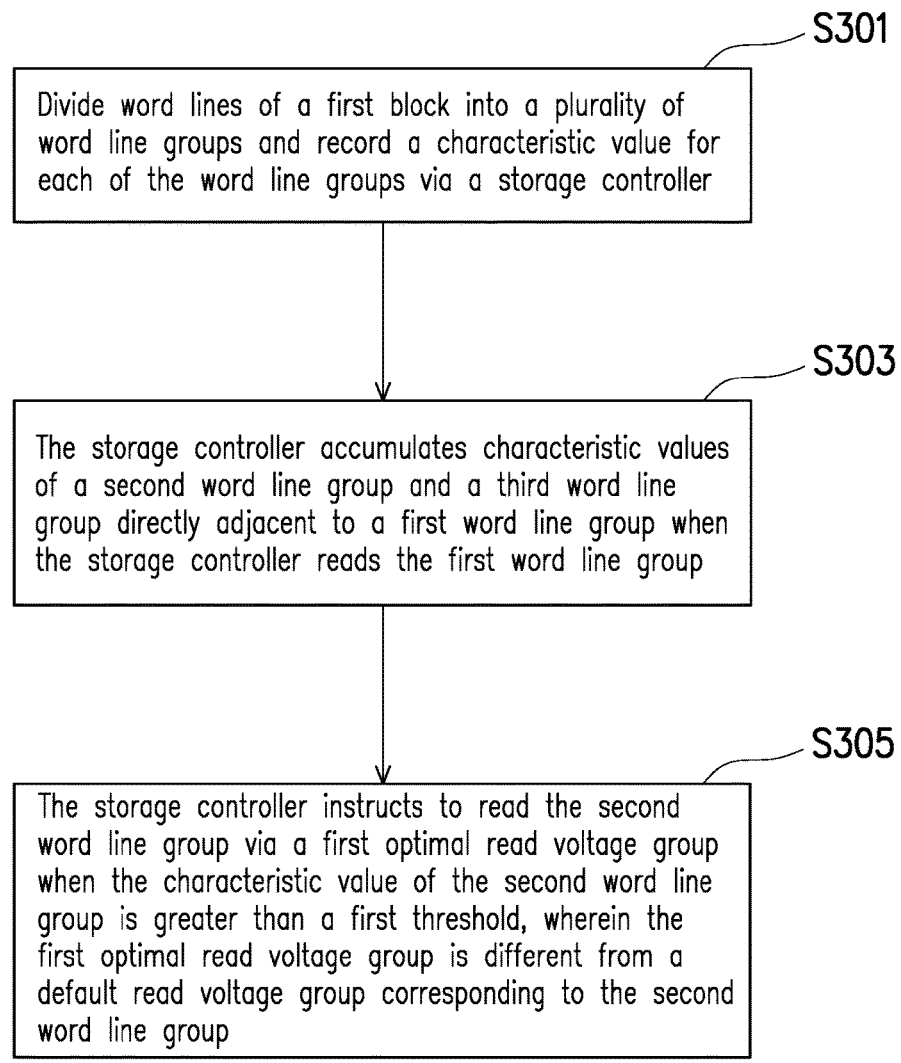
FIG. 3 is a flowchart of a memory management method according to an embodiment of the invention.

FIG. 3 is a flowchart of a memory management method according to an embodiment of the invention.

Referring to FIG. 3, in step S301, word lines of a first block are divided into a plurality of word line groups and a characteristic value is recorded for each of the word line groups via the storage controller 210. Specifically, the storage controller 210 can divide the word lines of one block into a plurality of word line groups according to stacked layers and record a characteristic value for each of the word line groups. Here, the characteristic value represents the number of times directly adjacent word line groups are read, and at the same time, the characteristic value is also related to the number of error bits of the word line groups.

In step S303, when the storage controller 210 reads a first word line group, the storage controller 210 accumulates the characteristic values of a second word line group and a third word line group directly adjacent to the first word line group. Specifically, when one word line group is read, the storage controller 210 accumulates the characteristic values of word line groups directly adjacent to the read word line group.

In step S305, when the characteristic value of the second word line group is greater than a first threshold, the storage controller 210 instructs to read the second word line group via a first optimal read voltage group, wherein the first optimal read voltage group is different from a default read voltage group corresponding to the second word line group. Specifically, when the characteristic value of the word line group is greater than the first threshold, the word line group is read disturbed and the probability of generating an error bit is higher. Therefore, the storage controller 210 does not read the word line group via a default read voltage group again, but reads the word line group via an optimal read voltage group. As a result, the quantity of error bits generated by read disturb to the word line group can be reduced. It should be mentioned that, when the storage controller 210 erases a physical block, the storage controller 210 sets all of the characteristic values of the word line groups of the physical block to 0.

In an embodiment, when the characteristic value of the third word line group is greater than a threshold (such as a second threshold), the storage controller 210 instructs to read the third word line group via a second optimal read voltage group, wherein the second threshold is greater than the first threshold. In other words, the storage controller 210 reads the word line groups using different optimal read voltage groups with the accumulation of the characteristic values of the word line groups to reduce the number of error bits.

When the read count of a word line group in one block is too high such that the generated number of error bits cannot be reduced via the adjustment of the optimal read voltage group, the storage controller 210 needs to moves the data of some of the word line groups of one block or the entire block to other blocks.

In an embodiment, when the characteristic value of the second word line group of the first block is greater than a threshold (such as a third threshold) or the average value of subtracting the characteristic values of all of the word line groups of the first block from the characteristic value of the second word line group of the block is greater than another threshold (such as a fourth threshold), the storage controller 210 moves the data of the second word line group to another block. Moreover, the storage controller 210 also resets the characteristic value of the second word line group and sets the data of the second word line group to invalid. For instance, when one word line group is repeatedly read (for instance, the word line group stores popular videos or popular data of the internet), the characteristic values of word line groups directly adjacent to the word line group are continuously accumulated. Therefore, the storage controller 210 can move the data stored in a word line group directly adjacent to a word line group storing popular data to other blocks to reduce the number of error bits caused by read disturb generated from a large amount of reading of the word line group storing popular data.

In another embodiment, when the average value of the characteristic values of the word line groups of the first block is greater than a threshold (such as a fifth threshold), the storage controller 210 moves the data of the first block to another block. Specifically, when a plurality of word line groups of an entire block is repeatedly read, the word line groups of the entire block are affected by read disturb such that the number of error bits is increased. Therefore, the data of the entire block needs to be directly moved to another block to reduce the number of error bits caused by read disturb.

Based on the above, in the memory management method and the storage controller of the invention, the word lines of one block are divided into a plurality of word line groups and a characteristic value is recorded for each of the word line groups. When one of the word line groups is read, the characteristic values of word line groups directly adjacent to the read word line group are accumulated. When the characteristic value of one word line group is greater than a threshold, the storage controller instructs to read the word line group for which the characteristic value is greater than the threshold via an optimal read voltage group different from a default read voltage group to reduce error caused by read disturb.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory management method suitable for controlling a storage device provided with a rewritable non-volatile memory module, wherein the storage device is controlled by a storage controller, the rewritable non-volatile memory module comprises a plurality of blocks, each of the blocks comprises a plurality of word lines, each of the word lines is formed by a plurality of memory cells, the blocks comprise a first block, and the memory management method comprises:

dividing the word lines of the first block into a plurality of word line groups and recording a characteristic value for each of the word line groups via the storage controller;

accumulating characteristic values of a second word line group and a third word line group in the word line groups via the storage controller when the storage controller reads a first word line group in the word line groups, wherein the second word line group and the third word line group are directly adjacent to the first word line group; and instructing to read the second word line group via a first optimal read voltage group by the storage controller when the characteristic value of the second word line group is greater than a first threshold, wherein the first optimal read voltage group is different from a default read voltage group corresponding to the second word line group.

2. The memory management method of claim 1, wherein when the characteristic value of the third word line group is greater than a second threshold, the storage controller instructs to read the third word line group via a second optimal read voltage group, wherein the second threshold is greater than the first threshold.

3. The memory management method of claim 1, wherein the first word line group, the second word line group, and the third word line group respectively belong to a first layer, a second layer, and a third layer in a plurality of stacked layers of the first block, wherein the second layer and the third layer are directly adjacent to the first layer.

4. The memory management method of claim 3, wherein the first word line group comprises a first memory cell, the second word line group comprises a second memory cell, the third word line group comprises a third memory cell, the second memory cell and the third memory cell are respectively disposed at opposite locations of the second layer and the third layer in correspondence to the first memory cell of the first layer, and the first memory cell, the second memory cell, and the third memory cell are disposed on a same bit line and the second memory cell and the third memory cell are directly adjacent to the first memory cell.

5. The memory management method of claim 1, wherein when the storage controller erases the first block, the storage controller sets the characteristic values of the word line groups of the first block to 0.

6. The memory management method of claim 1, wherein when the characteristic value of the second word line group is greater than a third threshold or an average value of subtracting the characteristic values of the word line groups of the first block from the characteristic value of the second word line group is greater than a fourth threshold, the storage controller moves a data of the second word line group to another block.

7. The memory management method of claim 6, wherein the storage controller resets the characteristic value of the second word line group and sets the data of the second word line group to invalid.

8. The memory management method of claim 1, wherein when an average value of the characteristic values of the word line groups of the first block is greater than a fifth threshold, the storage controller moves a data of the first block to another block.

9. A storage controller suitable for controlling a storage device provided with a rewritable non-volatile memory module, wherein the rewritable non-volatile memory module comprises a plurality of blocks, each of the blocks comprises a plurality of word lines, each of the word lines is formed by a plurality of memory cells, the blocks comprise a first block, and the storage controller comprises:
a connection interface circuit coupled to a host system;
a memory interface control circuit coupled to the rewritable non-volatile memory module; and
a processor coupled to the connection interface circuit and the memory interface control circuit, wherein the processor divides the word lines of the first block into a plurality of word line groups and records a characteristic value for each of the word line groups;
when the processor reads a first word line group in the word line groups, the processor accumulates characteristic values of a second word line group and a third word line group in the word line groups, wherein the second word line group and the third word line group are directly adjacent to the first word line group; and
when the characteristic value of the second word line group is greater than a first threshold, the processor instructs to read the second word line group via a first optimal read voltage group, wherein the first optimal read voltage group is different from a default read voltage group corresponding to the second word line group.

10. The storage controller of claim 9, wherein when the characteristic value of the third word line group is greater than a second threshold, the processor instructs to read the third word line group via a second optimal read voltage group, wherein the second threshold is greater than the first threshold.

11. The storage controller of claim 9, wherein the first word line group, the second word line group, and the third word line group respectively belong to a first layer, a second layer, and a third layer in a plurality of stacked layers of the first block, wherein the second layer and the third layer are directly adjacent to the first layer.

12. The storage controller of claim 11, wherein the first word line group comprises a first memory cell, the second word line group comprises a second memory cell, the third word line group comprises a third memory cell, the second memory cell and the third memory cell are respectively disposed at opposite locations of the second layer and the third layer in correspondence to the first memory cell of the first layer, and the first memory cell, the second memory cell, and the third memory cell are disposed on a same bit line and the second memory cell and the third memory cell are directly adjacent to the first memory cell.

13. The storage controller of claim 9, wherein when the processor erases the first block, the processor sets the characteristic values of the word line groups of the first block to 0.

14. The storage controller of claim 9, wherein when the characteristic value of the second word line group is greater than a third threshold or an average value of subtracting the characteristic values of the word line groups of the first block from the characteristic value of the second word line group is greater than a fourth threshold, the processor moves a data of the second word line group to another block.

15. The storage controller of claim 14, wherein the processor resets the characteristic value of the second word line group and sets the data of the second word line group to invalid.

16. The storage controller of claim 9, wherein when an average value of the characteristic values of the word line groups of the first block is greater than a fifth threshold, the processor moves a data of the first block to another block.

* * * * *